(12) United States Patent
Kushiya et al.

(10) Patent No.: US 7,960,642 B2
(45) Date of Patent: Jun. 14, 2011

(54) CIS BASED THIN-FILM PHOTOVOLTAIC MODULE AND PROCESS FOR PRODUCING THE SAME

(75) Inventors: Katsumi Kushiya, Tokyo (JP); Norimasa Akema, Tokyo (JP); Manabu Tanaka, Tokyo (JP)

(73) Assignee: Showa Shell Sekiyu K.K., Tokyo (JP)

( * ) Notice: Subject to any disclaimer, the term of this patent is extended or adjusted under 35 U.S.C. 154(b) by 361 days.

(21) Appl. No.: 12/092,094

(22) PCT Filed: Oct. 31, 2006

(86) PCT No.: PCT/JP2006/321778
§ 371 (c)(1),
(2), (4) Date: Apr. 30, 2008

(87) PCT Pub. No.: WO2007/052671
PCT Pub. Date: May 10, 2007

(65) Prior Publication Data
US 2009/0159112 A1  Jun. 25, 2009

(30) Foreign Application Priority Data

Oct. 31, 2005 (JP) ................................. 2005-316846

(51) Int. Cl.
*H01L 31/0203* (2006.01)
*H01L 31/048* (2006.01)

(52) U.S. Cl. ........ 136/251; 136/259; 136/244; 136/252; 136/256

(58) Field of Classification Search ............... 136/251, 136/244, 252, 258, 264
See application file for complete search history.

(56) References Cited

U.S. PATENT DOCUMENTS

| | | | |
|---|---|---|---|
| 4,481,265 A | 11/1984 | Ezawa et al. | |
| 5,626,688 A | 5/1997 | Probst et al. | |
| 6,104,530 A * | 8/2000 | Okamura et al. | 359/359 |
| 6,469,242 B1 * | 10/2002 | Kondo | 136/251 |
| 2003/0205270 A1 * | 11/2003 | Stanbery | 136/262 |

(Continued)

FOREIGN PATENT DOCUMENTS

JP  58-216476 A  12/1983

(Continued)

OTHER PUBLICATIONS

Chinese Office Action dated Dec. 26, 2008.

(Continued)

*Primary Examiner* — Jennifer K. Michener
*Assistant Examiner* — Jayne Mershon
(74) *Attorney, Agent, or Firm* — Sughrue Mion, PLLC

(57) ABSTRACT

A photovoltaic module having long-term durability is obtained at low cost.
A CIS based thin-film photovoltaic module 1 is obtained by bonding a cover glass 4 comprising, e.g., a semi-tempered white flat glass, which is inexpensive and durable, to a CIS based thin-film photovoltaic circuit 2 on a glass substrate 2A with a thermally crosslinked ethylene vinyl acetate (hereinafter referred to as EVA) resin film 3 (or sheet) as an adhesive. Use of the EVA resin film 3 reduces the amount of an EVA resin to be used. In the crosslinking, a gas generating from the EVA resin film is removed by vacuum suction to prevent bubble generation or inclusion, etc. A high-capacity storage capacitor 9 is disposed on that side of the glass substrate which is opposite to the circuit side to store the electricity optically generated by the circuit.

3 Claims, 5 Drawing Sheets

U.S. PATENT DOCUMENTS

2004/0261836 A1* 12/2004 Kataoka et al. ............... 136/244

FOREIGN PATENT DOCUMENTS

| JP | 60-137306 | U | | 9/1985 |
|---|---|---|---|---|
| JP | 62-48761 | U | | 3/1987 |
| JP | 08-222750 | A | | 8/1996 |
| JP | 10-233522 | A | | 9/1998 |
| JP | 11-216832 | A | | 8/1999 |
| JP | 2001-503197 | A | | 3/2001 |
| JP | 2001-274437 | A | | 10/2001 |
| JP | 2003-079054 | A | | 3/2003 |
| JP | 2003-158825 | A | | 5/2003 |
| JP | 2003-258282 | A | | 9/2003 |
| JP | 2004-186547 | | * | 7/2004 |
| JP | 2004-186547 | A | | 7/2004 |
| JP | 2004-532501 | A | | 10/2004 |
| JP | 2005-123552 | A | | 5/2005 |
| WO | 2004/038811 | A1 | | 5/2004 |

OTHER PUBLICATIONS

Joint Research Program of Technological Development in the Private Sectors, 26, "Development of Production Technique for High-Capacity Capacitor based on CNT Application" (p. 26), 2001.

Focus Nedo, vol. 3, No. 14, Result & Report 3, "Development of Integrated Solar Module with Electric Double-Layer Capacitor and Planar Light Emitter" (pp. 11-12).

* cited by examiner

CIS BASED THIN-FILM PHOTOVOLTAIC MODULE AND PROCESS FOR PRODUCING THE SAME

TECHNICAL FIELD

The present invention relates to a CIS based thin-film photovoltaic module constituted of heterojunction thin-film photovoltaic devices employing a multinary-compound semiconductor thin film as a light absorption layer, and to a process for producing the module and a method of installing the module.

BACKGROUND ART

CIS based thin-film photovoltaic modules were recently regarded as practically usable extensively, and have been commercialized in the United States, Germany, etc. In Japan also, performance advancement and production technique developments are being promoted enthusiastically. The research and development works made so far and described in reports on module production concerning long-term durability and in reports on evaluation through an environmental test have been directed to CIS based thin-film photovoltaic modules characterized by thinness, resource saving, large area, and ability to be mass-produced. However, few reports have been made on the durability of the module. On the other hand, with respect to a photovoltaic module with crystalline silicon solar cells, a technique (or structure) has been employed in which with crystalline silicon solar cells array obtained by electrically connecting crystalline silicon solar cells with ribbon conductors or the like is sandwiched between two transparent plates, e.g., glass plates, and this photovoltaic array is embedded in a crosslinked EVA resin or enclosed in a crosslinked EVA resin in order to maintain durability (see, for example, patent document 1). However, this crystalline silicon photovoltaic module has a drawback that it necessitates a glass plate for sandwiching the photovoltaic array besides the cover glass disposed on the light incidence side. In the case of a CIS based thin-film photovoltaic module, one glass plate suffices, i.e., one cover glass only is necessary, because a photovoltaic module is formed on a glass substrate. Because of this, the number of light-transmitting glass plates to be used increases. In addition, the EVA resin, which is expensive, should be used in a large amount. These have been factors contributing to a cost increase. A CIS based thin-film photovoltaic module differs in basic structure from the crystalline silicon photovoltaic module. Namely, the CIS based thin-film photovoltaic module is constituted of a glass substrate having relatively high mechanical strength and photovoltaic devices formed on this substrate. There is a desire for a durable structure suitable for the CIS based thin-film photovoltaic module.

Although a CIS based thin-film photovoltaic module is characterized by thinness, resource saving, and large area, the electricity generated by the CIS based thin-film photovoltaic module is stored in a secondary battery disposed outside the module, such as, e.g., a lead storage battery, nickel-hydrogen battery, nickel-cadmium battery, or lithium battery, before being used or sold. However, these secondary batteries have problems concerning the storage capacity, weight, and volume thereof, etc. Because of this, it has been impossible to unite such a secondary battery with the photovoltaic module.

In recent years, however, investigations on capacitors as high-capacity electricity storage elements which are lightweight and thin have proceeded (see, for example, patent document 2 and non-patent document 1), and various applications thereof have been proposed.

Furthermore, attempts have been made to unite a photovoltaic module with the capacitor for electricity storage (see, for example, patent document 1, non-patent document 1, and non-patent document 2). However, in the case where the photovoltaic module is a crystalline silicon photovoltaic module, a structural member for maintaining mechanical strength is required to be additionally disposed for uniting this photovoltaic module with a capacitor for electricity storage, because this photovoltaic module neither has a large area nor employs a glass substrate with high mechanical strength unlike the CIS based thin-film photovoltaic module. There is hence a problem that the uniting results in increases in weight, volume, and cost.

Patent Document 1: JP-A-2005-123552
Patent Document 2: JP-T-2001-503197 (The term "JP-T" as used herein means a published Japanese translation of a PCT patent application).
Non-Patent Document 1: *Joint Research Program of Technological Development in the Private Sectors*, 26, "Development of Production Technique for High-Capacity Capacitor based on CNT Application" (p. 26)
Non-Patent Document 2: *Focus NEDO*, Vol. 3, No. 14, Result & Report 3, "Development of Integrated Solar Module with Electric Double-Layer Capacitor and Planar Light Emitter" (pages 11-12)

DISCLOSURE OF THE INVENTION

Problems that the Invention is to Solve

The invention eliminates the problems described above. An object of the invention is to obtain at low cost a CIS based thin-film photovoltaic module having long-term durability which enables the module to withstand use in outdoor environments.

Another object of the invention, which eliminates the problems described above, is to prevent bubble inclusion in a CIS based thin-film photovoltaic circuit by conducting vacuum evacuation, subsequently heating an EVA resin film to melt and spread it, and then crosslinking the EVA resin film at atmospheric pressure.

Still another object of the invention is to reduce the amount of an expensive back sheet to be used and thereby attain a cost reduction.

A further object of the invention is to obtain at low cost a CIS based thin-film photovoltaic module which has long-lasting durability, is small and lightweight, and has high electricity storage capacity, by disposing a storage capacitor as a thin, lightweight electricity storage device having a high capacity on the back side (the side opposite to the sunlight incidence side) of the glass substrate of the CIS based thin-film photovoltaic device parts of the CIS based thin-film photovoltaic module.

Still a further object of the invention is to reduce the cost of the installation or use of a CIS based thin-film photovoltaic module by using the CIS based thin-film photovoltaic module which has a low cost, long-term durability, and the ability to store electricity in such a manner that inexpensive nighttime electricity is stored in the storage capacitor and the electricity generated from sunlight in the daytime is used or sold.

Means for Solving the Problems (1) The invention provides a CIS based thin-film photovoltaic module which comprises a structure constituted of a CIS based thin-film photovoltaic circuit (or submodule) and a cover glass comprising a semi-tempered glass or the like bonded to the photovoltaic circuit with an ethylene vinyl acetate (hereinafter referred to as EVA) resin film (or sheet), as an adhesive, which has been crosslinked through thermal polymerization reaction, wherein the photovoltaic circuit comprises CIS based thin-film photovoltaic device parts which each comprise a glass substrate and, superposed on the substrate in the following order, an alkali barrier layer, a metallic back electrode layer, a light absorption layer, a buffer layer, and a window layer and which have been electrically connected to each other with a conductivity by patterning.

(2) The invention provides the CIS based thin-film photovoltaic module as described under (1) above, which comprises the structure including a back sheet bonded to a peripheral part of that side of the glass substrate of the CIS based thin-film photovoltaic circuit (or submodule) which is opposite to the light incidence side (i.e., opposite to the side having the photovoltaic circuit).

(3) The invention provides the CIS based thin-film photovoltaic module as described under (1) or (2) above, wherein the glass substrate has holes formed in given positions and piercing the substrate from the CIS based thin-film photovoltaic circuit side to the opposite side and further has a conductive film formed on the inner walls of the holes, the conductive film serving to connect the CIS based thin-film photovoltaic circuit to an electronic part disposed on the side opposite to the circuit.

(4) The invention provides the CIS based thin-film photovoltaic module as described under (1), (2), or (3) above, which has a high-capacity storage capacitor disposed on that side of the glass substrate which is opposite to the CIS based thin-film photovoltaic circuit.

(5) The invention provides the CIS based thin-film photovoltaic module as described under (3) above, wherein the storage capacitor stores, in the daytime, the electricity generated from light by the CIS based thin-film photovoltaic circuit and stores inexpensive nighttime electricity in the night.

(6) The invention provides a process for producing a CIS based thin-film photovoltaic module, which comprises bonding a cover glass comprising a semi-tempered glass or the like to a CIS based thin-film photovoltaic circuit (or submodule) with an ethylene vinyl acetate (hereinafter referred to as EVA) resin film (or sheet) serving as an adhesive by crosslinking the resin through thermal polymerization reaction, the photovoltaic circuit comprising CIS based thin-film photovoltaic device parts which each comprise a glass substrate and, superposed on the substrate in the following order, an alkali barrier layer, a metallic back electrode layer, a light absorption layer, a buffer layer, and a window layer and which have been electrically connected to each other with a conductivity by patterning.

(7) The invention provides the process for producing a CIS based thin-film photovoltaic module as described under (6) above, wherein a gas which generates when the EVA resin film (or sheet) is crosslinked is removed by vacuum suction to prevent bubble generation, etc.

(8) The invention provides the process for producing a CIS based thin-film photovoltaic module as described under (6) and (7) above, which comprises placing on the CIS based thin-film photovoltaic circuit an EVA resin film (or sheet) having the same size as the glass substrate, placing a strip-form EVA resin film (or sheet) on each of the four corners, placing a cover glass thereon, putting the resultant assemblage constituted of the CIS based thin-film photovoltaic circuit, the cover glass, and the EVA resin films (or sheets) held therebetween into a vacuum heating apparatus, heating (hot plate) the assemblage to 80-120° C. with vacuum evacuation to cause the EVA resin films (or sheets) to melt and spread over the whole glass, subsequently gradually returning the internal pressure to atmospheric pressure and pressing the assemblage, and then heating (hot plate) the assemblage at a temperature of 140° C.-150° C. to crosslink the EVA resin films (or sheets).

Advantages of the Invention

According to the invention, an EVA resin film (or sheet) is cross linked by thermally causing it to undergo polymerization reaction to thereby use the resin as an adhesive. A cover glass comprising a semi-tempered glass or the like is bonded to CIS based thin-film photovoltaic device parts (circuit or submodule) through the crosslinked EVA resin film. Thus, a CIS based thin-film photovoltaic module having long-term durability which enables the module to withstand use in outdoor environments can be obtained at low cost.

According to the invention, bubble inclusion in a CIS based thin-film photovoltaic circuit can be prevented by heating the EVA resin film with vacuum evacuation in crosslinking the resin.

According to the invention, a back sheet which is expensive and is to be disposed on the back side (the side opposite to the sunlight incidence side) of the glass substrate of the CIS based thin-film photovoltaic device parts of the CIS based thin-film photovoltaic module is disposed on part (peripheral part) of the module. Thus, the amount of the back sheet to be used is reduced, and a CIS based thin-film photovoltaic module having long-term durability can be obtained at low cost.

Furthermore, a CIS based thin-film photovoltaic module which is small and lightweight and has high electricity storage capacity can be obtained according to the invention by disposing a storage capacitor, a small, lightweight, high-capacity electricity storage device which was developed and commercialized in recent years, on the back side (the side opposite to the sunlight incidence side) of the glass substrate of the CIS based thin-film photovoltaic device parts of the CIS based thin-film photovoltaic module having low cost and long-lasting durability.

Moreover, the invention can reduce the cost of the installation or use of a CIS based thin-film photovoltaic module by installing the CIS based thin-film photovoltaic module which has a low cost, long-term durability, and the ability to store electricity to thereby store inexpensive nighttime electricity in the storage capacitor and use or sell the electricity generated from sunlight in the daytime.

DESCRIPTION OF THE REFERENCE NUMERALS AND SIGNS

Figure 1:
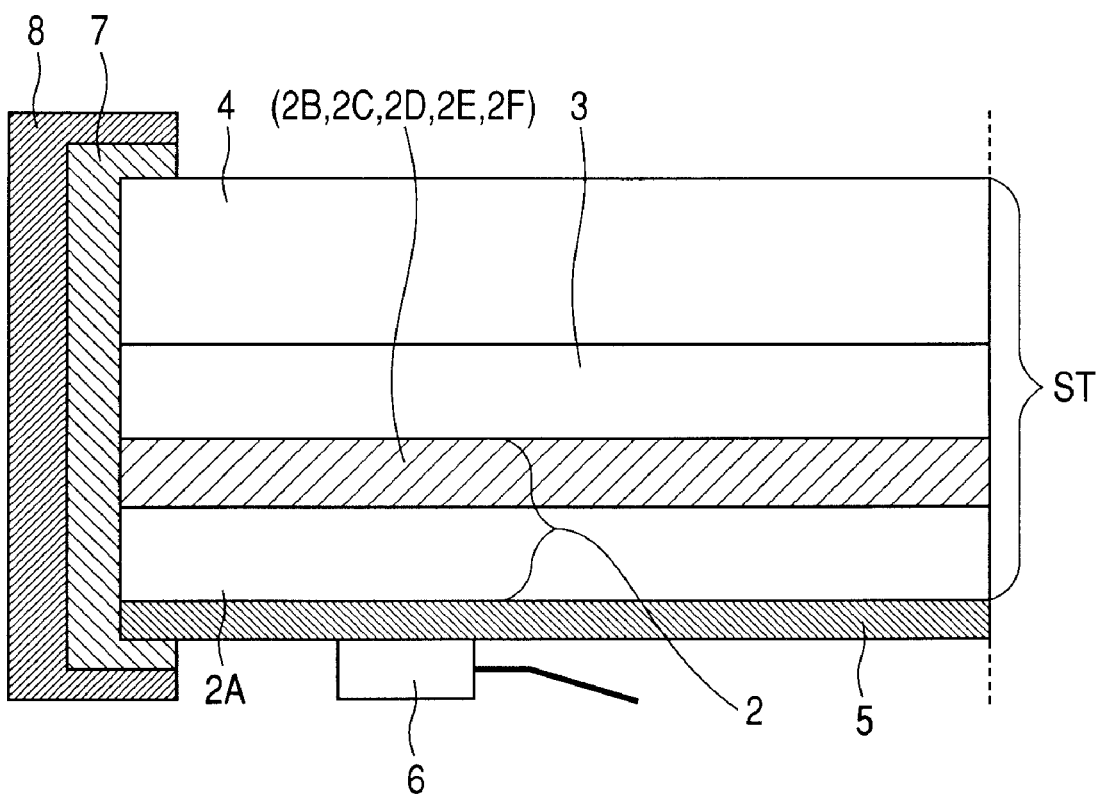
FIG. 1 is a view showing the constitution of a CIS based thin-film photovoltaic module of the invention.

1 CIS based thin-film photovoltaic module
2 CIS based thin-film photovoltaic circuit 2' CIS based thin-film photovoltaic device part
2A glass substrate
2B alkali barrier layer
2C metallic back electrode layer
2D light absorption layer
2E buffer layer
2F window layer
3 EVA resin film (or sheet)
3A strip-form EVA resin film
4 cover glass
5 back sheet
6 terminal box with cable
7 sealing material
8 frame
9 capacitor for electricity storage
ST structure

BEST MODE FOR CARRYING OUT THE INVENTION

Figure 2:
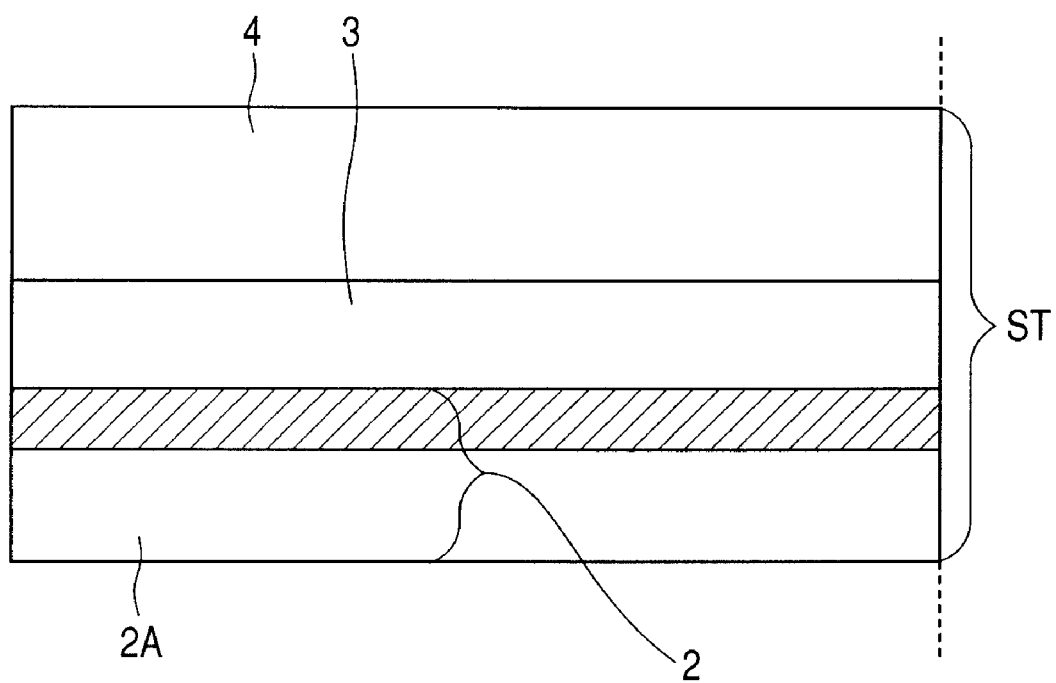
FIG. 2 is a view showing the constitution of a basic structure of the CIS based thin-film photovoltaic module.

The invention relates to a CIS based thin-film photovoltaic module and a process for producing the module. The CIS based thin-film photovoltaic module 1 may be the CIS based thin-film photovoltaic module shown in FIG. 1, which includes heterojunction thin-film photovoltaics employing a multinary-compound semiconductor thin film as a light absorption layer, in particular, a CIS based thin-film photovoltaic circuit (circuit (or submodule) constituted of CIS based thin-film photovoltaic devices 2' connected to each other by patterning) 2 having a pn heterojunction with the light absorption layer of a p-type semiconductor, such as a Cu-III-VI$_2$ Group chalcopyrite semiconductor, e.g., copper indium diselenide (CISe), copper indium gallium diselenide (CIGSe), copper indium gallium diselenide-sulfide (CIGSSe), or copper indium gallium disulfide (CIGS), or copper indium gallium diselenide (CIGSe) having a thin film of copper indium gallium diselenide-sulfide (CIGSSe) as a surface layer. In producing the CIS based thin-film photovoltaic module 1, a structure ST is formed which is composed of the CIS based thin-film photovoltaic circuit 2 and a cover glass 4 bonded thereto with a plastic resin film (or sheet) 3, e.g., a crosslinked EVA resin, as an adhesive as shown in FIG. 2. Furthermore, a back sheet 5 and a terminal box 6 having a cable attached thereto are disposed on the back of the structure ST, and a frame is attached to the periphery of this structure ST through a sealing material 7 as shown in FIG. 1.

Figure 3:
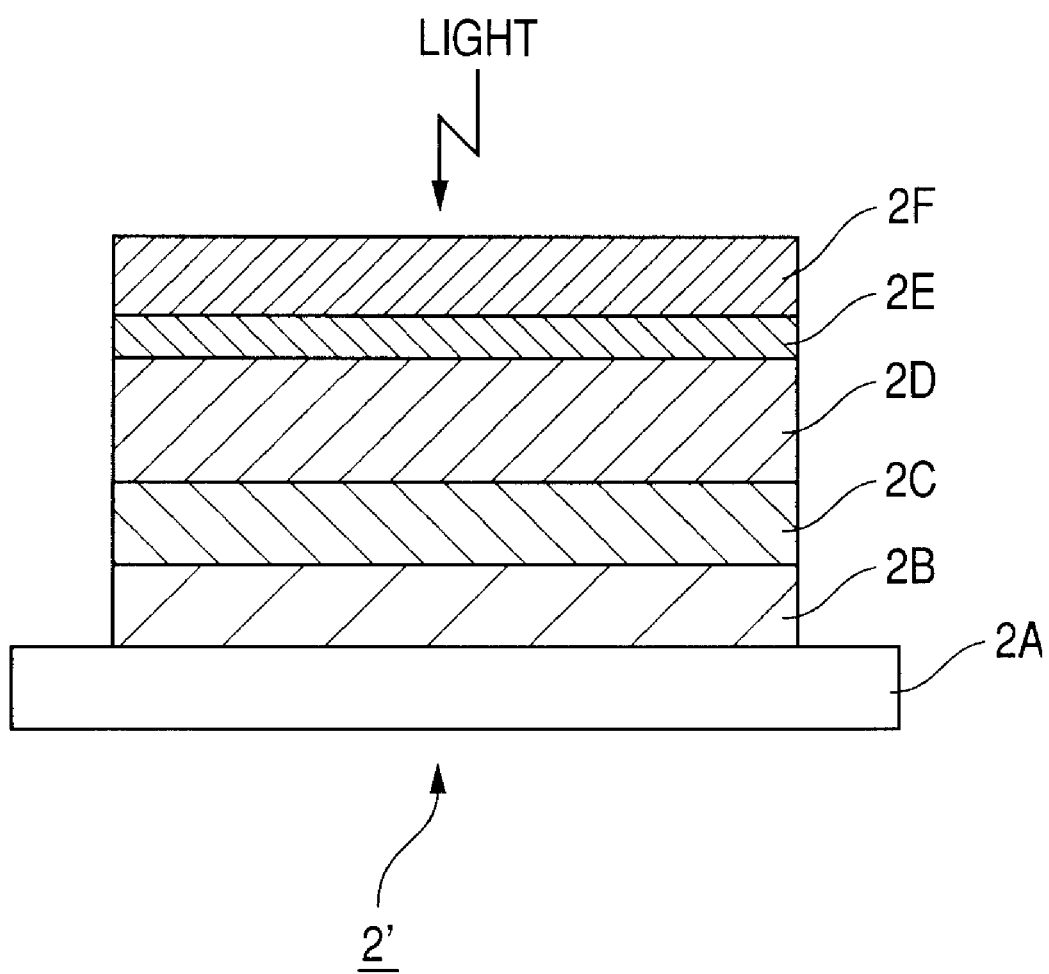
FIG. 3 is a view showing the constitution of a CIS based thin-film photovoltaic device.

Each CIS based thin-film photovoltaic device part 2' is a multilayer structure constituted of a glass substrate 2A and, superposed thereon in the following order, an alkali barrier layer 2B, a metallic back electrode layer 2C, a light absorption layer 2D of a p-type semiconductor, a high-resistance buffer layer 2E, and a window layer 2F constituted of an n-type transparent conductive film, as shown in FIG. 3.

A feature of the CIS based thin-film photovoltaic module of the invention resides in the structure in which a cover glass 4 such as, e.g., a semi-tempered glass, which is relatively inexpensive and has high mechanical strength and durability, has been bonded to a CIS based thin-film photovoltaic circuit 2 on a glass substrate 2A with an ethylene vinyl acetate (hereinafter referred to as EVA) resin film (or sheet; hereinafter referred to as film) 3, as an adhesive, which has been crosslinked through thermal polymerization reaction. Use of the EVA resin film 3 reduces the amount of an EVA resin to be used, whereby a reduction in production cost can be attained. Furthermore, when a semi-tempered glass is used as the cover glass 4, durability can be improved.

A gas which generates when the EVA resin film 3 is crosslinked is removed by vacuum suction to prevent bubble generation or inclusion, etc.

A process for producing the structure ST, which is constituted of the CIS based thin-film photovoltaic circuit 2 and a cover glass 4 bonded thereto with a plastic resin film 3 such as, e.g., a crosslinked EVA resin as an adhesive, is shown below in detail.

On the CIS based thin-film photovoltaic circuit 2 is placed an EVA resin film 3 having the same size as the glass substrate 2A. Furthermore, a strip-form EVA resin film 3A (not shown) is placed on each of the four corners, and a cover glass 4 is placed thereon. The resultant assemblage ST constituted of the CIS based thin-film photovoltaic circuit 2, the cover glass 4, and the EVA resin films 3 and 3A held therebetween is put into a vacuum heating apparatus, and heated (hot plate) to 80-120° C. with vacuum evacuation to cause the EVA resin films to melt and spread over the whole glass. Subsequently, the internal pressure is gradually returned to atmospheric pressure, and the assemblage is pressed. Thereafter, the assemblage is heated (hotplate) at a temperature of 140° C.-150° C. to crosslink the EVA resin films 3 and 3A. The reason why strip-form EVA resin films 3A are placed respectively on the four corners is as follows. In case where the EVA resin film 3 having the same size as the glass substrate 2A is placed as the only EVA resin film, the molten EVA resin overflows from the four corners during pressing. As a result, edge parts become thinner and the thickness of the EVA resin layer becomes uneven. The strip-form EVA resin films are hence placed in order to compensate for the loss.

By heating the assemblage with vacuum evacuation to cause the EVA resin films to melt and spread, the air present between the EVA resin films 3 and 3A and the CIS based thin-film photovoltaic circuit 2 and between the EVA resin films 3 and 3A and the cover glass 4 is removed and the gas which generates from the EVA resin films 3 and 3A upon heating is also removed. Thus, the structure ST can be prevented from coming to have bubbles attributable to that air or to the gas generated from the EVA resin films 3. The structure ST can hence be prevented from decreasing in light transmittance and appearance. Furthermore, since the EVA resin films 3 and 3A to be used are in film or sheet form, the amount of an EVA resin to be used is reduced, whereby a reduction in production cost is attained.

Figure 5:
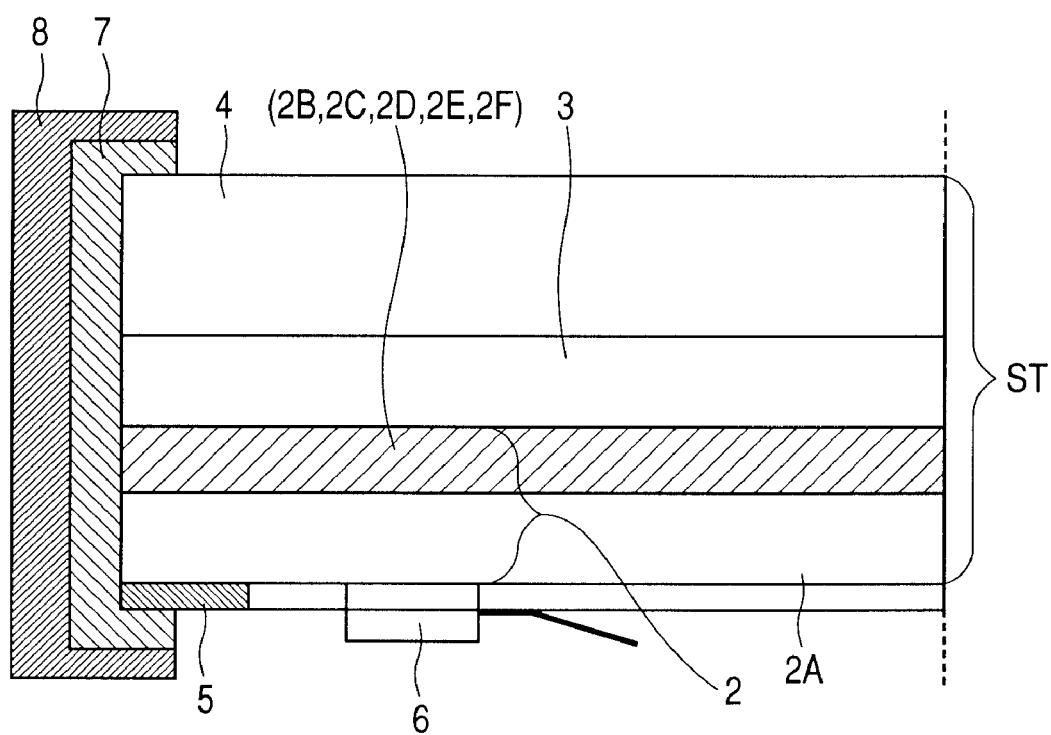
FIG. 5 is a view showing the constitution of a CIS based thin-film photovoltaic module of the invention which has a modified-form back sheet.

In the CIS based thin-film photovoltaic module 1 of the invention, the back sheet 5 has been bonded to that side of the glass substrate 2A of the CIS based thin-film photovoltaic circuit 2 which is opposite to the light incidence side (i.e., opposite to the side having the photovoltaic circuit) as shown in FIG. 1. However, by disposing the back sheet 5 on a peripheral part (near the frame 8) of the CIS based thin-film photovoltaic module 1 as shown in FIG. 5, the amount of a back sheet 5 to be used is reduced. A reduction in production cost can hence be attained.

Another feature of the CIS based thin-film photovoltaic module 1 of the invention resides in that holes are formed in the glass substrate 2A beforehand in given positions so as to pierce the substrate 2A from the CIS based thin-film photovoltaic circuit side to the opposite side and a conductive film is formed on the inner walls of the holes in forming a metallic back electrode layer or patterning techniques. The conductive film is used in connecting the CIS based thin-film photovoltaic circuit 2 to an electronic part to be disposed on the side opposite to the circuit 2.

Example 1

Figure 4:
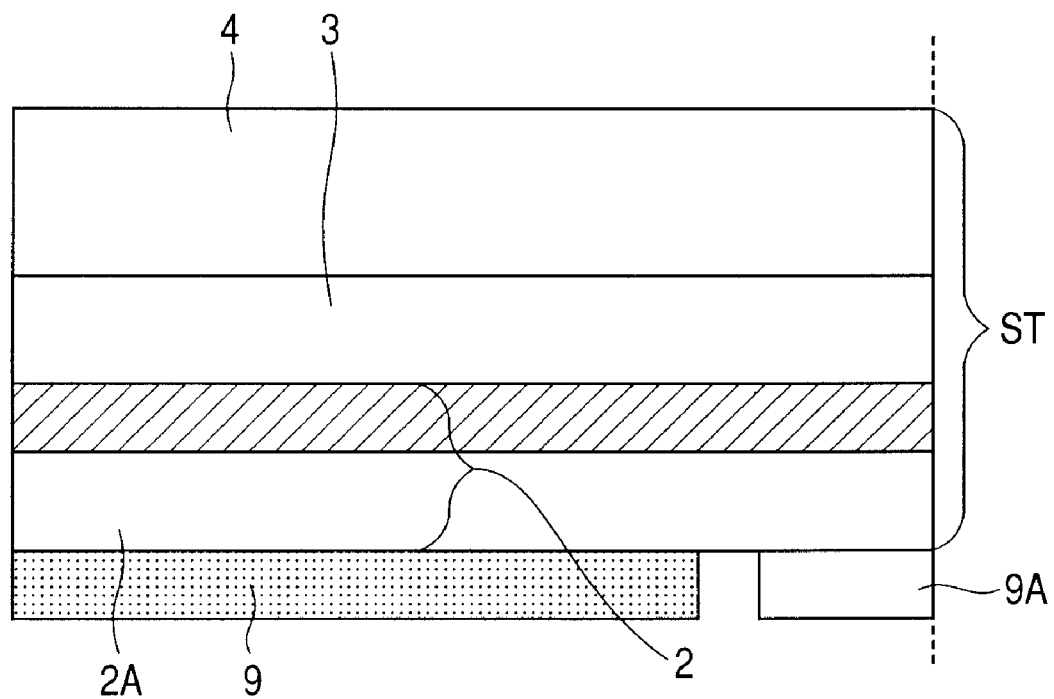
FIG. 4 is a view showing the constitution of a CIS based thin-film photovoltaic module comprising the basic structure and a capacitor for electricity storage disposed on the structure.

Still another feature of the CIS based thin-film photovoltaic module 1 of the invention resides in that a high-capacity storage capacitor 9 is disposed on that side of the glass substrate 2A which is opposite to the CIS based thin-film photovoltaic circuit, as shown in FIG. 4. The storage capacitor 9 has a capacity corresponding to the power-generating ability of the CIS based thin-film photovoltaic circuit 2 on the glass substrate on which the capacitor 9 is disposed. The storage capacitor 9 is disposed for each module 1. In the case where a storage capacitor having a storage capacity higher than the power-generating ability of the CIS based thin-film photovoltaic circuit 2 is used, this capacitor is disposed in combination with CIS based thin-film photovoltaic modules 1 having no storage capacitor as shown in FIG. 1 according to the storage capacity of the capacitor. The CIS based thin-film photovoltaic module 1 having the storage capacitor 9 may be installed near the equipment for receiving power supply from the electric power company or on a peripheral part of the roof, e.g., an upper end, lower end, or side end part. Such an installation position is convenient in case of a failure of the module 1 or for replacement thereof, etc.

Example 2

A further feature of the CIS based thin-film photovoltaic module 1 of the invention resides in that the CIS based thin-film photovoltaic module 1 having the storage capacitor 9 can store, in the daytime, the electricity generated from light by the CIS based thin-film photovoltaic module 1 and store inexpensive nighttime electricity in the night. Thus, a reduction in maintenance cost after installation can be attained.

The invention claimed is:

1. A process for producing a CIS based thin-film photovoltaic module, characterized by bonding a cover glass comprising a semi-tempered glass to a CIS based thin-film photovoltaic circuit (or submodule) with an ethylene vinyl acetate (hereinafter referred to as EVA) resin film (or sheet) serving as an adhesive by crosslinking the resin through thermal polymerization reaction, wherein the photovoltaic circuit comprises CIS based thin-film photovoltaic device parts which each comprise a glass substrate and, superposed on the substrate in the following order, an alkali barrier layer, a metallic back electrode layer, a light absorption layer, a buffer layer, and a window layer and which have been electrically connected to each other with a conductivity by patterning, wherein the process further comprises placing on the CIS based thin-film photovoltaic circuit a filmy EVA resin film (or sheet) having the same size as the glass substrate, placing a strip-form EVA resin film (or sheet) only on each of the four corners, placing a cover glass thereon, putting the resultant assemblage constituted of the CIS based thin-film photovoltaic circuit, the cover glass, and the EVA resin films (or sheets) held therebetween into a vacuum heating apparatus, heating (hot plate) the assemblage with vacuum evacuation to cause the EVA resin films (or sheets) to melt and spread over the whole glass, subsequently gradually returning the internal pressure to atmospheric pressure and pressing the assemblage, and heating (hot plate) the assemblage to crosslink the EVA resin films (or sheets).

2. The process for producing a CIS based thin-film photovoltaic module according to claim 1, wherein a gas which generates when the EVA resin film (or sheet) is crosslinked is removed by vacuum suction to prevent bubble generation, etc.

3. The process for producing a CIS based thin-film photovoltaic module according to claims 1 or 2, wherein the heating (hot plate) of the assemblage with vacuum evaporation is to 80-120° C. to cause the EVA resin films (or sheets) to melt and spread over the whole glass, and wherein the heating (hot plate) of the assemblage to crosslink the EVA resin films (or sheets) is at a temperature of 140° C.-150° C.

* * * * *